US 6,693,316 B2

(12) United States Patent
Tanaka et al.

(10) Patent No.: US 6,693,316 B2
(45) Date of Patent: Feb. 17, 2004

(54) SEMICONDUCTOR APPARATUS HAVING A CHARGE PUMP CIRCUIT

(75) Inventors: Toshimasa Tanaka, Kyoto (JP); Hironori Oku, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/991,307

(22) Filed: Nov. 13, 2001

(65) Prior Publication Data

US 2002/0060333 A1 May 23, 2002

(30) Foreign Application Priority Data

Nov. 17, 2000 (JP) ........................................ 2000-350896
Oct. 15, 2001 (JP) ........................................ 2001-316701

(51) Int. Cl.[7] ........................ H01L 27/108; H01L 29/76
(52) U.S. Cl. ........................ 257/299; 257/300; 257/312
(58) Field of Search ................................ 257/299, 312, 257/300

(56) References Cited

U.S. PATENT DOCUMENTS 5,544,102 A * 8/1996 Tobita et al. .......... 365/189.01
6,303,957 B1 * 10/2001 Ohwa ......................... 257/296

* cited by examiner

Primary Examiner—Amir Zarabian
Assistant Examiner—Kiesha Rose
(74) Attorney, Agent, or Firm—Hogan & Hartson

(57) ABSTRACT

A charge pump circuit includes a multiplicity of first electrodes, insulating layers, and a multiplicity of second electrodes. The multiplicity of first electrodes are formed at multiple locations within one region of the substrate, wherein the multiplicity of first electrodes are interconnected. The insulating layers are formed on/above respective substrate regions between neighboring first electrodes, each layer covering at least the respective substrate region. The multiplicity of second electrodes are formed on/above the respective insulating layers, wherein the multiplicity of second electrodes are interconnected.

16 Claims, 10 Drawing Sheets

US 6,693,316 B2

SEMICONDUCTOR APPARATUS HAVING A CHARGE PUMP CIRCUIT

FIELD OF THE INVENTION

The invention relates to a semiconductor apparatus having a charge pump circuit, and more particularly to a semiconductor apparatus having a charge pump circuit which includes MOS type charge pump capacitors.

BACKGROUND OF THE INVENTION

Semiconductor apparatuses such as an LCD driver which has a low-voltage logic and a high-voltage logic on the same semiconductor chip are designed to generate a high voltage by stepping up a low-voltage of a low voltage supply using a charge pump circuit.

FIG. 1 illustrates such a charge pump circuit 11, in which a high voltage Vo (15 V) is obtained for a load 12 by stepping up a low voltage supply Vcc (about 3 V) of the power supply 13. As shown in FIG. 1, the charge pump circuit 11 has: p-type MOSFETs Q1–Qn connected in series between an input terminal IN and an output terminal OUT; series inversion buffer circuits B1–Bn for supplying gate voltages to the respective MOSFETs Q1–Qn; capacitors C1–Cn each having one end connected with a respective MOSFET (Q1–Qn) or with the output terminal OUT; series inversion buffer circuits B1a–Bn-1a for supplying, predetermined voltages to the respective capacitors Q1–Qn; inversion buffer circuits B1–Bn; and an oscillator circuit OSC for providing clock signals to the inversion buffer circuits B1a–Bn-1a, the clock signals switching between predetermined high and low levels. (Capacitors C3 through Cn-1 and inversion buffer circuits B3 through Bn-1a are not shown.) The capacitor Cn in the last stage may be external to the charge pump circuit as shown in FIG. 1, if necessary, when large power is required by the load.

In operation, the charge pump circuit 11 generates a low (L) output at the output of the inversion buffer circuit B1 to thereby turn on the MOSFET Q1 when the output of the oscillator circuit OSC is high (H), and causing the output of the inversion buffer circuit B2 to become H to thereby turn off the MOSFET Q2. The outputs of the inversion buffer circuit B1a and the B2a are L and H, respectively. Consequently, the capacitor C1 is charged to the supply voltage Vcc.

Next, as the output of the oscillator circuit OSC goes low L, the output of the inversion buffer circuit B1 goes high H, thereby turning off the MOSFET Q1, while the output of the inversion buffer circuit B2 goes low L, thereby turning on the MOSFET Q2. At this stage, the output levels of the inversion buffer circuits B1a and B2a are H and L, respectively. Consequently, as a result of charge conservation principle, the capacitor C2 is charged with the charged voltage (Vcc) of the capacitor C1 plus the high output (Vcc) of the inversion buffer circuit B1a, thereby creating two times the supply voltage Vcc across the capacitor C2.

In this way, at every inversion of the oscillator circuit OSC between H and L levels, capacitor Cn acquires a voltage stepping up towards the required voltage Vo for the load 12.

Thus, in forming a charge pump circuit on one semiconductor chip together with a low-voltage circuit (not shown), their capacitors C1–Cn-1 are mostly MOS capacitors, aligned in shape and size with other MOS transistors.

Such MOS capacitors are described in detail below with reference to FIGS. 2 and 3. An N-well region 21 is formed on a p-type semiconductor substrate (referred to as substrate) 20. Formed within the N-well region 21 are N⁺ regions 22-1 and 22-2 which are enriched with impurity to provide a higher conductivity. Formed on an insulating oxide layer (not shown) which overlies the N-well region 21, and between the N⁺ regions 22-1 and 22-2, is a gate electrode 23. If a p-type MOSFET were formed on the N-well region 21, the N⁺ regions 22-1 and 22-2 would make a p⁺-type drain and a source, respectively, and the N-well region 21 between the N⁺ regions 22-1 and 22-2, a channel region. (The N-well region will be hereinafter sometimes referred to channel region.)

A gate electrode 23 is connected with a lead wire 24 (which is an aluminum wiring layer 26 in FIG. 3) for connection with the terminal T1. The N⁺ regions 22-1 and 22-2 are connected with a common lead wire 25 (which is an aluminum wiring layer 27 in FIG. 3) to maintain the regions at the same potential and to connect the regions with the terminal T2. Thus, a capacitor is provided between the gate electrode 23 and the N⁺ regions 22-1 and 22-2, serving as a MOS capacitor. Similar capacitors are formed between the two wiring layers 26 and 27 and between the wiring layer 27 and the gate electrode 23, however, their capacitances are not important. In addition, oxide layers 28-1 and 28-2 are provided on the opposite ends of the N-well for isolation thereof from adjacent N-wells.

The magnitudes of these capacitances may not be sufficient for building up the required charging voltage when the power consumed by the load 12 is large. In that case, in order to provide sufficiently large power at all times, the switching frequency of the MOSFETs Q1–Qn, i.e., the frequency of the oscillator circuit OSC, must be set high.

Unfortunately, the MOS capacitors as shown in FIGS. 2 and 3 have a disadvantageous characteristic (hereinafter referred to as voltage dependent characteristic) that their capacitances vary with the voltages applied thereto. This is because the capacitance of the MOS capacitor is determined by the sum of two series capacitances, that is, the capacitance of the dielectric gate oxide layer and the capacitance of the channel region (e.g. capacitance of the depletion layer) which depends on the physical condition of the channel region.

Although the capacitance of the gate oxide layer depends on the thickness thereof, it has a fixed value in that it has no voltage dependence. The capacitance of the channel region, on the other hand, depends on the physical conditions of the channel region, which in turn depends on the voltage applied thereto in different ways. For example, it depends on whether the channel is formed or not, and the thickness of the channel formed. Thus, the MOS capacitance depends on the voltage.

Of course the voltage dependence of the MOS capacitor would not matter so long as the capacitor can build up a sufficiently large voltage. However, a MOS capacitor for a charge pump circuit is subjected to frequent charging and discharging, and hence its voltage is always changing. Particularly, the voltage impressed on the first stage MOS capacitor is low and the resistance of the N-well region 21 forming the channel is large, so that it requires a fairly long time to gain an appreciable capacitance subsequent to the application of the voltage, thereby exhibiting a poor frequency response.

FIG. 4 shows such voltage dependent characteristic of the MOS capacitor for a switching frequency SW.f of 1 MHz. In FIG. 4, the abscissa represents the voltage Vg across the terminals T1 and T2 of a MOS capacitor. The ordinate represents the capacitance C of the MOS capacitor. The voltage Vg is applied across the terminals T1 and T2, with the terminal T1 being positive.

The static saturation capacitance of the MOS capacitor is about 750 pF as shown by a dotted line in FIG. 4. It is seen that the voltage dependence is saturated in the range from 2 V to 3 V. However, the rise of the capacitance is not steep and its saturated level is lower than the static capacitance due to high switching frequency. This characteristic varies with switching frequency.

The frequency response of the MOS capacitor may be improved through an additional manufacturing step of minimizing the resistance of the electrodes and modifying the characteristics of the N-well.

It is, however, not quite as easy to change the resistance of the electrodes and the characteristic of the N-well because the MOS capacitors are formed in the process of manufacturing the MOSFETs. Besides, if the change were possible, it would require additional time and cost.

Hence, the MOS capacitors have the drawback that their voltage dependence limits the stepping up performance of the charge pump circuit.

SUMMARY OF THE INVENTION

In accordance with one aspect of the invention, there is provided a semiconductor apparatus having a charge pump circuit which includes MOSFETs and MOS capacitors formed on the same substrate, wherein at least one of the MOS capacitors includes:

a multiplicity of first electrodes formed at multiple locations within one region of the substrate, wherein the multiplicity of first electrodes are interconnected;

insulating layers formed on/above respective substrate regions between neighboring first electrodes, each layer covering at least the respective substrate region; and a multiplicity of second electrodes formed on/above the respective insulating layers, wherein said multiplicity of second electrodes are interconnected.

In accordance with another aspect of the invention, there is provided a charge pump circuit including:

a multiplicity of first electrodes formed at multiple locations within one region of a substrate, wherein the multiplicity of first electrodes are interconnected;

insulating layers formed on/above respective substrate regions between neighboring first electrodes, each layer covering at least the respective substrate region; and a multiplicity of second electrodes formed on/above the respective insulating layers, wherein the multiplicity of second electrodes are interconnected.

In accordance with another aspect of the invention, there is provided a method of forming a charge pump circuit including:

forming a multiplicity of first electrodes at multiple locations within one region of a substrate;

forming insulating layers above insulating substrate regions between neighboring first electrodes;

forming a multiplicity of second electrodes above respective insulating layers;

interconnecting the multiplicity of first electrodes; and interconnecting the multiplicity of second electrodes.

DETAILED DESCRIPTION OF THE PREFERRED EMBODIMENT

The invention will now be described in detail by way of example with reference to the accompanying drawings.

Figure 5:
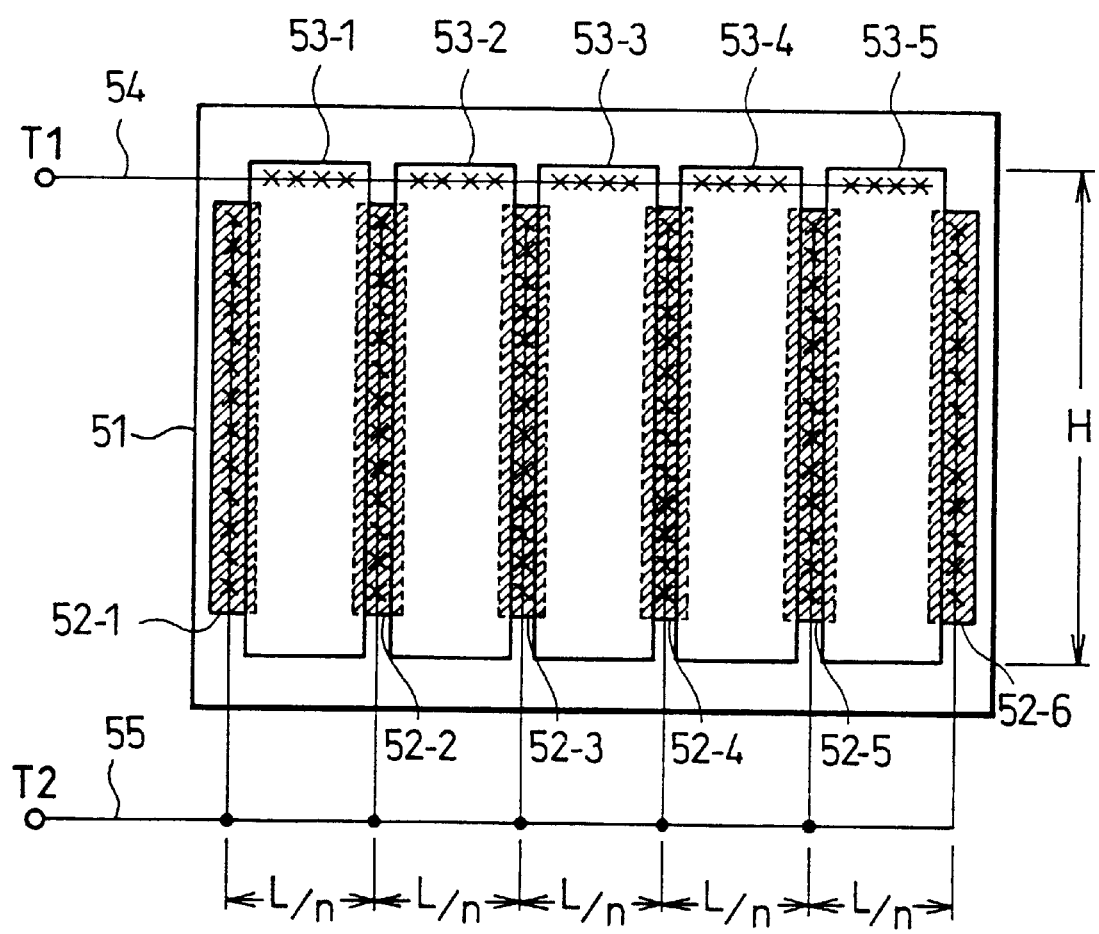
FIG. 5 is a top view of a MOS capacitor for use in a charge pump circuit according to the invention.
Figure 6:
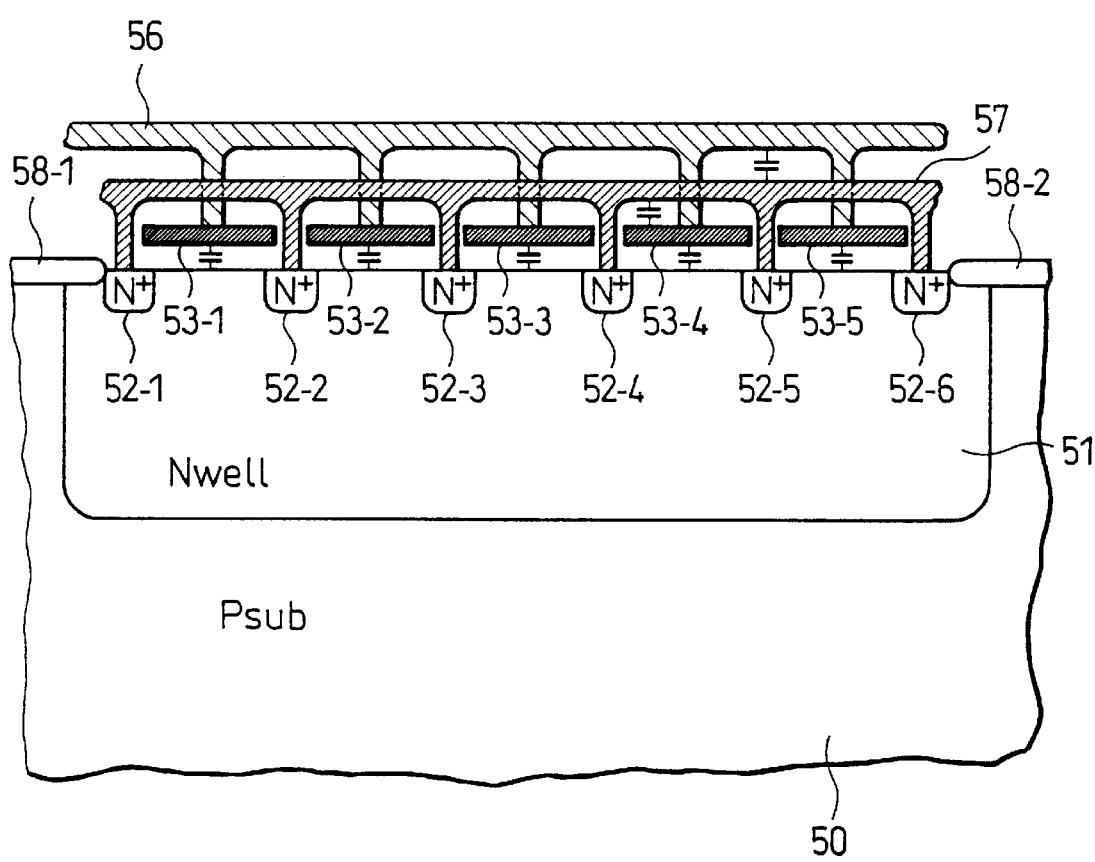
FIG. 6 is a cross sectional view of the MOS capacitor of FIG. 5.

Referring to FIGS. 5 and 6, there is shown a MOS capacitor of one embodiment of the invention, used in a charge pump circuit formed together with other elements such as MOSFETs on the same semiconductor substrate of a semiconductor apparatus. Particularly, FIGS. 5 and 6 schematically show the top view and the cross sectional view, respectively, of the MOS capacitor of the invention.

FIG. 7 shows an equivalent circuit of a MOS capacitor, representing the operation of the MOS capacitor. FIG. 8 compares voltage-capacitance characteristic of an inventive MOS capacitor with that of a conventional MOS capacitor.

As shown in FIGS. 5 and 6, an N-well region 51 is formed on a p-type substrate 50. The N-well region 51 is surrounded by isolation regions in the form of, for example, oxide layers 58-1 and 58-2 to electrically isolate the MOS capacitor from other elements on the substrate. Such isolation regions can be provided not only by the oxide layers, but also by different means such as isolation trenches.

In addition to $N^+$ regions 52-1 and 52-6 serving as electrodes in a manner similar to conventional ones, there are provided, on the surface of the N-well region 51, four elongate $N^+$ regions 52-2 through 52-5 serving as electrodes. Thus, five (n=5) inter-electrode regions are defined on the N-well regions 51 between the six $N^+$ regions, i.e. six electrode regions 52-1 through 52-6. These $N^+$ regions 52-1–52-6 are connected at one ends thereof with an equipotential lead wire 55 (which is shown as an aluminum wiring layer 57 in FIG. 6) extending to the terminal T2.

On the other hand, five gate electrodes 53-1–53-5 are formed on insulating oxide layers (not shown) which overlie the respective N-well regions, and which in turn locate between $N^+$ regions 52-1-52-6. Preferably, these gate electrodes 53-1–53-5 partly overlap the respective $N^+$ regions 52-1–52-6 via the insulating oxide layer (not shown). The electrodes 53-1–53-5 are connected at one ends thereof with an equipotential lead wire 54 (which is shown in FIG. 6 as an aluminum wiring layer 56) extending form the terminal T1. Crosses in FIG. 5 represent contact points of the lead wires.

Thus, in this arrangement, capacitors are formed between the gate electrodes 53-1 and a pair of N regions 52-1 and 52-2; between the gate electrode 53-2 and a pair of $N^+$ regions 52-2 and 52-3; between the gate electrode 53-3 and a pair of $N^+$ regions 52-3 and 52-4; between the gate electrode 53-4 and a pair of $N^+$ regions 52-4 and 52-5, and between the gate electrode 53-5 and a pair of $N^+$ regions 52-5–53-6.

These capacitors are connected in parallel to serve as MOS capacitors between the two terminals T1 and T2. Although similar capacitors are formed between the two wiring layers 56 and 57, between the wiring layer 57 and the gate electrodes 53-1–53-5, their capacitances are not very large.

The operation of inventive MOS capacitors of a charge pump circuit will now be described in comparison to conventional ones.

In the MOS capacitors shown in FIGS. 5 and 6, the resistance of an N-well 51 of the channel region is far greater than those of the gate electrodes 53-1–53-5. As an example, the sheet resistance of the gate electrodes 53-1–53-5 is 10 Ω, and the resistance of the N-well 51 is 1 kΩ.

Based on this example, resistances of a conventional MOS capacitor and that of the invention can be calculated as follows. First, assuming that a MOS capacitor has a width L and a length H, one obtains for conventional MOS capacitor;

Gate resistance Rg: (H/L)×10 Ω

N-well resistance Rn/w: (L/H)×(½)×1 kΩ

For brevity, further assume that H=L. Then, the above formula result in;

Gate resistance: Rg=10 Ω, and

N-well resistance: Rn/w=500 Ω

Figure 7A:
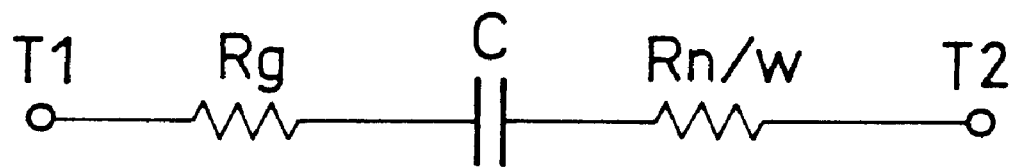
FIG. 7 shows an equivalent circuit of a MOS capacitor useful in explaining the operation of the inventive MOS capacitor shown in FIG. 5.
Figure 8:
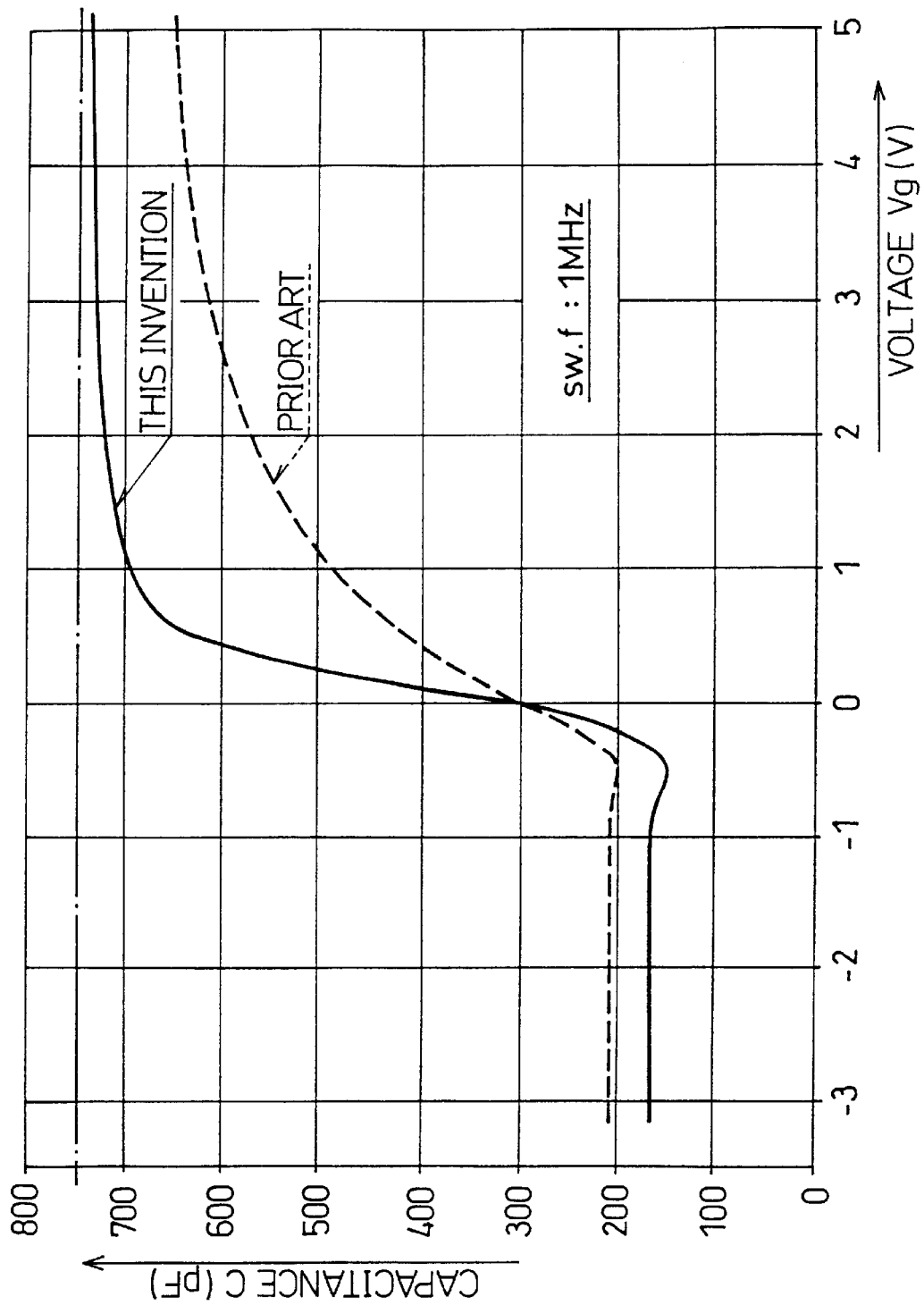
FIG. 8 is a graphical representation of the voltage-capacitance characteristic of the MOS capacitor of FIG. 5.

The equivalent circuit of this conventional MOS capacitor is shown in FIG. 7A. The symbol C represents the capacitance of the MOS capacitor. The symbol w represents the number of electrodes, which is 2 in the example shown.

On the other hand, in the invention, capacitance is divided into five MOS capacitors in five branches (referred to as divided capacitors). Based on the same assumption that the width and the length are L and H, respectively, one obtains;

Gate resistance Rg1: {H/(L/5)}×10 Ω

N-well resistance Rn/w1: {(L/5)/H}× (1/2)×1 Ω

Assuming that H=L for brevity, one obtains;

Gate resistance: Rg1=50 Ω, and

N-well resistance: Rn/w1=100 Ω

Figure 7B:
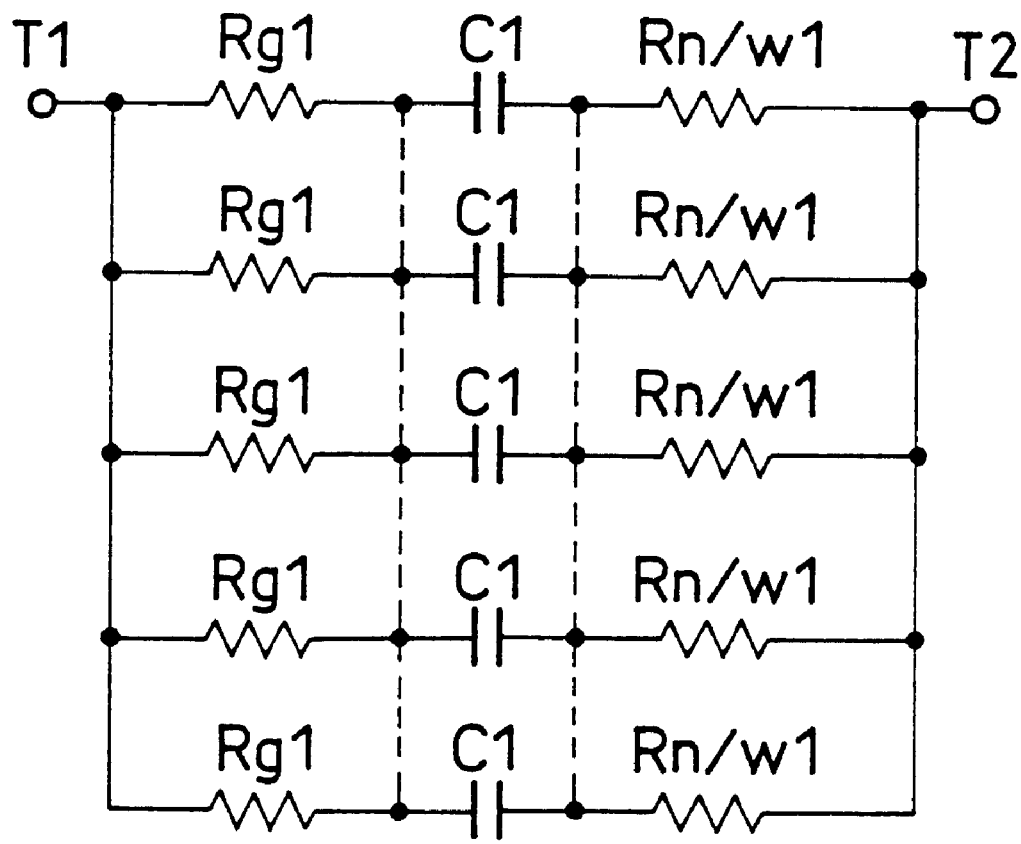

An equivalent circuit of the inventive step-up circuit is shown in FIG. 7B. The symbol C1 represents the divisional MOS capacitance. In this arrangement, the MOS capacitance is distributed over five parallel divisional MOS capacitors of capacitance C1 connected in series with a gate resistance Rg1 and an N-well resistance Rn/w1. It is noted that MOS capacitors as a whole have the same frequency response, so that the frequency characteristic of only one MOS capacitor need be examined. It should be clear that the total capacitance for the charge pump circuit having n stages is given the sum of these divisional MOS capacitors.

Thus, in the example shown herein, N-well resistance Rn/w1 is reduced (from 500 Ω to 100 Ω), and so is the sum of the gate resistance Rg1 and N-well resistance Rn/w1 (from 510 Ω to 150 Ω).

Next, referring to FIG. 7A, the frequency characteristic of a voltage dependent conventional MOS capacitor of capacitance C in series with a gate resistance Rg and an N-well resistance Rn/w will now be described.

First, it is noted that charging of the MOS capacitor, charged by a voltage applied across the terminals T1 and T2, is slowed down by the voltage drop due to the gate resistance Rg and the N-well resistance Rn/w. The degree of the slowing depends on the magnitudes of the gate resistance Rg and the N-well resistance Rn/w. Second, because of the slowing down of charging, the capacitance C of the MOS capacitor must remain voltage dependent for a long period of time.

Figure 2:
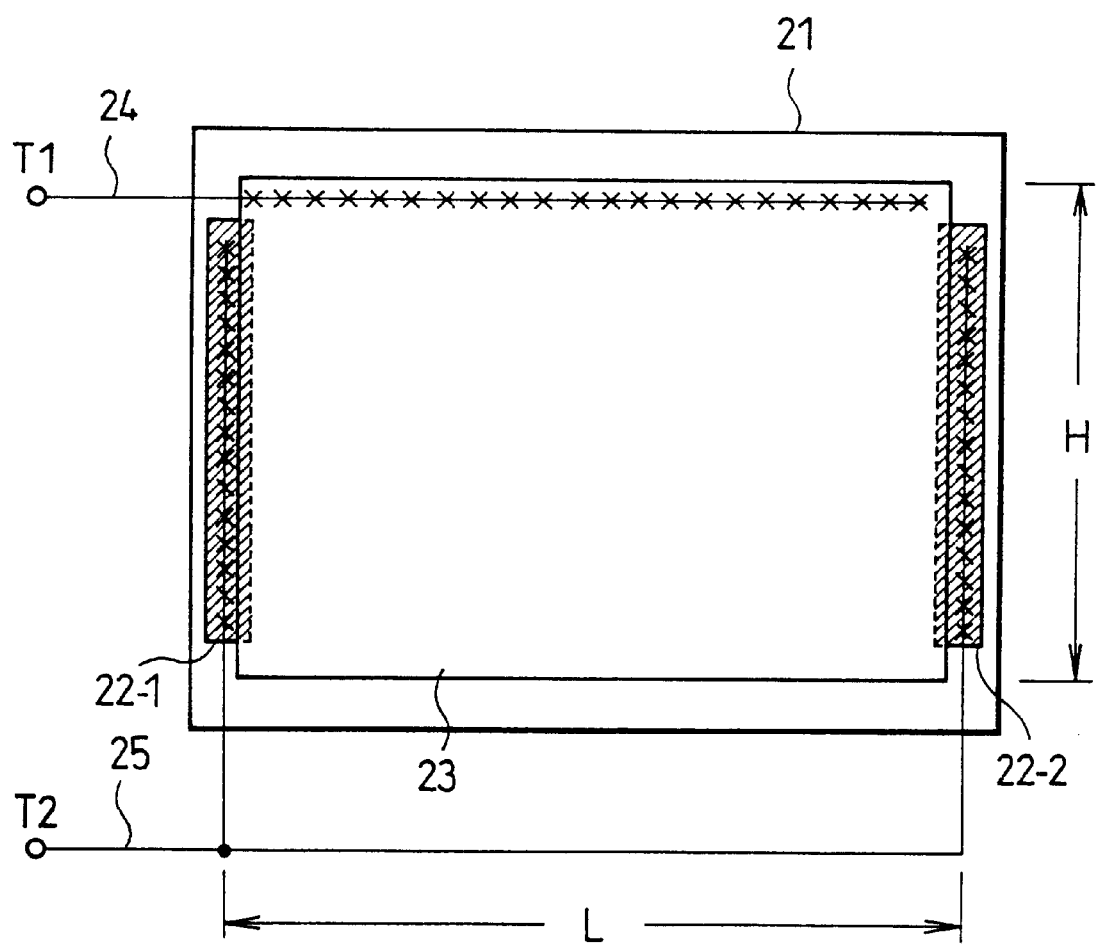
FIG. 2 is a top view of a conventional MOS capacitor used in a charge pump circuit.
Figure 3:
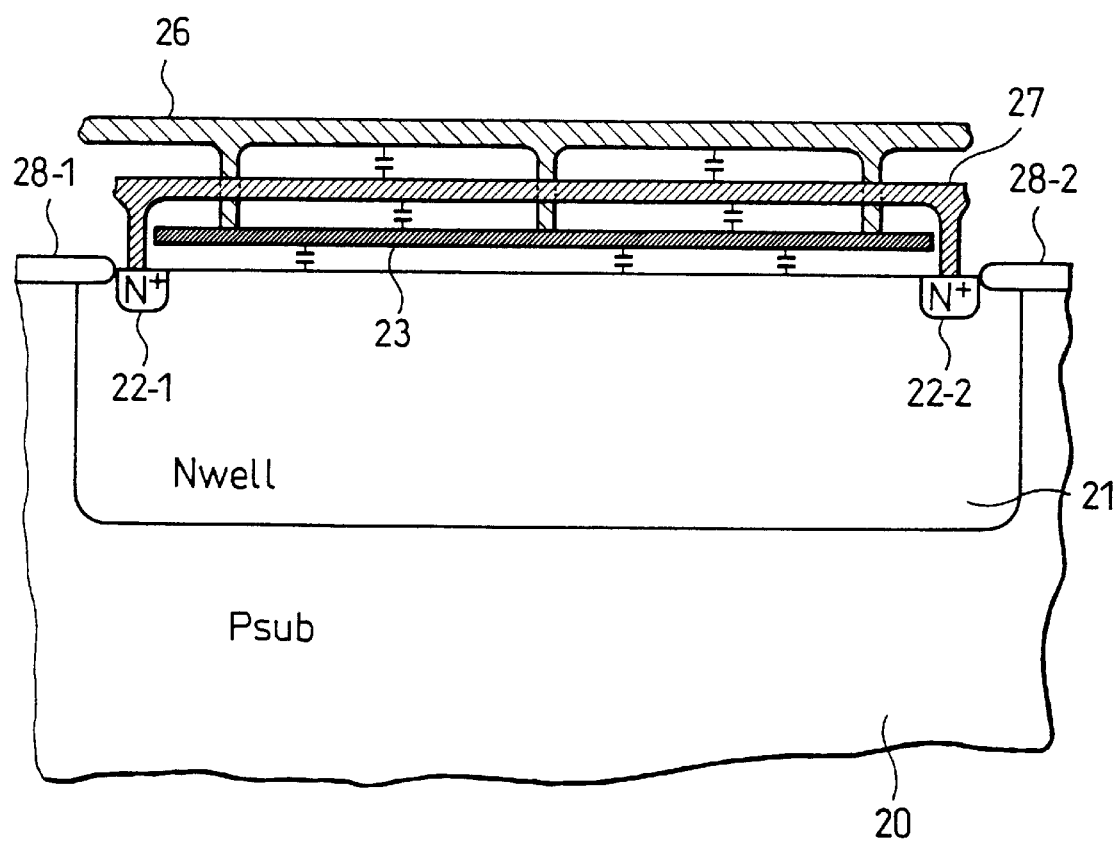
FIG. 3 is a cross sectional view of the MOS capacitor of FIG. 2.

In a comparison of the inventive MOS capacitor as shown in FIGS. 5 and 6 to the prior art MOS capacitor as shown in FIGS. 2 and 3, it is seen that the sum of the gate resistance Rg1 and the N-well resistance Rn/w1 of each branch is reduced and so is the capacitance C1 of each branch. As a result, the inventive MOS capacitors have a shorter time constant for charging and hence they are charged quickly. This means that the time in which capacitance C1 of a MOS capacitor remains voltage dependent becomes shorter. If it is assumed that all of the divisional MOS capacitors have the same gate resistance Rg1, N-well resistance Rn/w1, and MOS capacitance C1, the electric potentials at the points indicated by each broken line are the same, as seen in FIG. 7B. Hence, these equipotential points may be connected. Of course the can be left disconnected.

Thus, the invention provides five divisional MOS capacitors Cl by forming five N-wells 51 between the respective six N+ regions 52-1–52-6 serving as the electrodes of one polarity and five gate electrodes 53-1–53-5 of another polarity, such that the parallel divisional MOS capacitors C1 as a whole serve as a large MOS capacitor for the charge pump circuit.

In this way, the sum of the gate resistance Rg and the N-well resistance Rn/w is reduced to decrease undesirable frequency response that would be otherwise caused by the resistances Rg and Rn/w. Accordingly, although the capacitance of each MOS capacitor is voltage dependent, the frequency response of the MOS capacitor is improved. This is the case even for high frequency operation of the charge pump circuit, so that the step-up performance of the charge pump circuit is secured.

Figure 4:
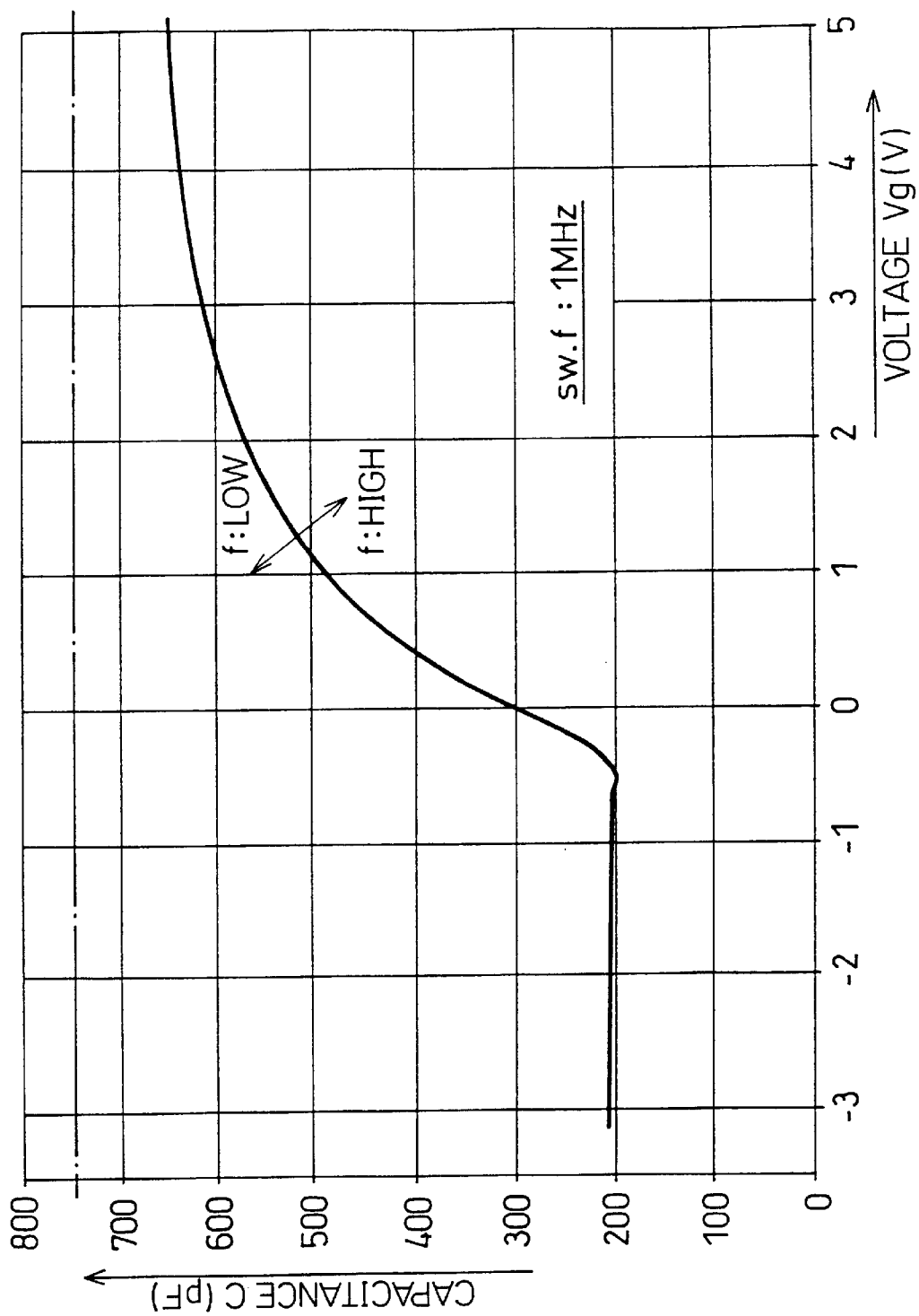
FIG. 4 is a graphical representation of the voltage-capacitance characteristic of a conventional MOS capacitor of a charge pump circuit.

FIG. 8 illustrates the voltage-capacitor characteristic (solid curve) of an inventive MOS capacitor in comparison with a prior art MOS capacitor (broken curve). As in FIG. 4, FIG. 8 shows the characteristic of the exemplary MOS capacitors for a switching frequency of 1 MHz. The abscissa represents applied voltage Vg across the terminals T1 and T2 with the terminal T1 being positive. The ordinate represents capacitance C.

Although the inventive MOS capacitor has a little voltage dependence, it attains a large capacitance close to the static (saturation) capacitance of about 750 pF (dotted line) under a relatively low applied voltage (about 2 V) even when the switching frequency is as high as 1 MHz. That is, the MOS capacitor has a saturation capacitance close to that of the static capacitance (i.e. capacitance for zero frequency).

In the example shown herein, the number n of regions between the N+ regions is 5. It would be apparent, however, that the number is arbitrary, and n can be any number greater than 1.

In the example shown herein, the N+ regions 52-1–52-6 have elongate rectangular shapes and extend in parallel with one another. However, they are not limited to this arrangement. For example, they may have an extra N+ region 52A at one end thereof for connection with the neighboring regions as shown in FIG. 9.

Figure 9:
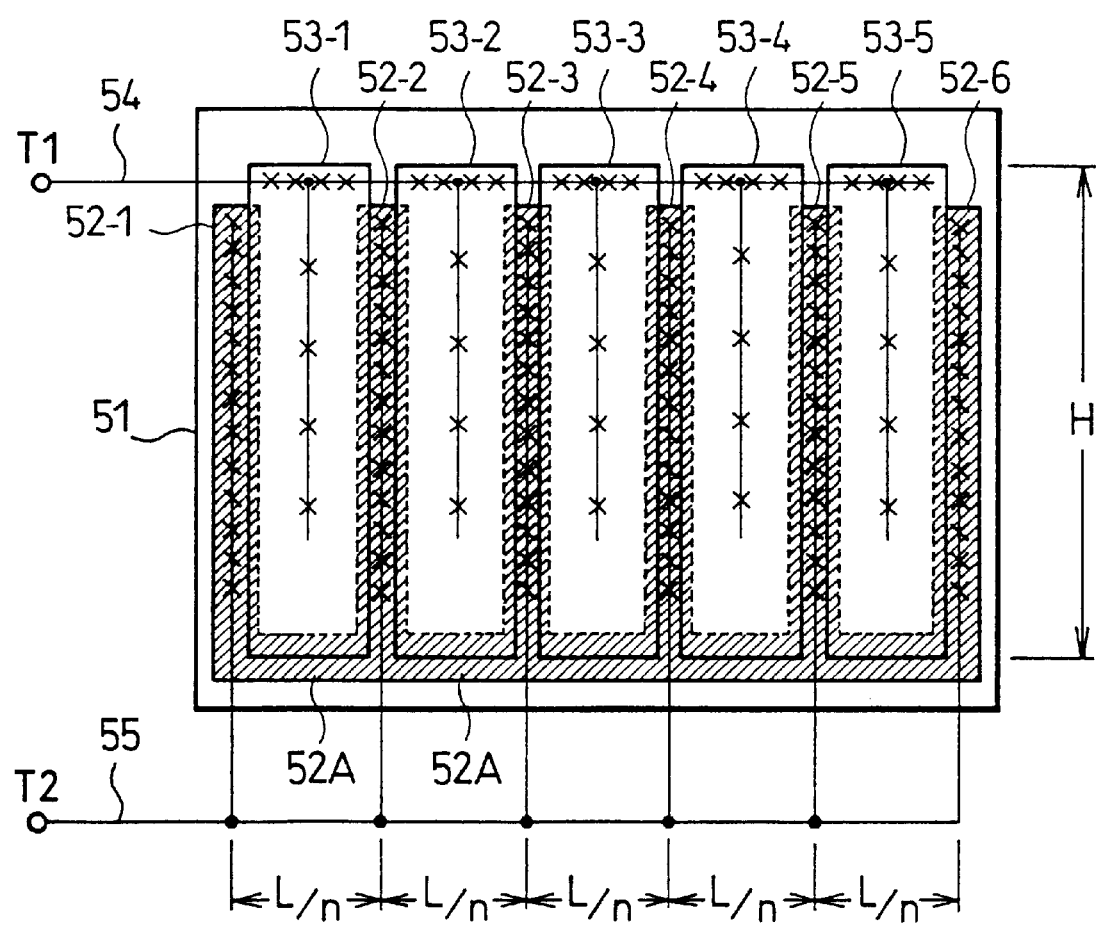
FIG. 9 is a top view of a further MOS capacitor for use in a charge pump circuit according to the invention.

Instead of connecting the gate electrodes 53-1–53-5 together at the other end thereof by the lead wire 54, they can be connected together by further lead wires 54 which extend from the lead wire 54 over the respective gate regions and are connected to the respective regions at multiple points, as shown in FIG. 9.

Figure 10:
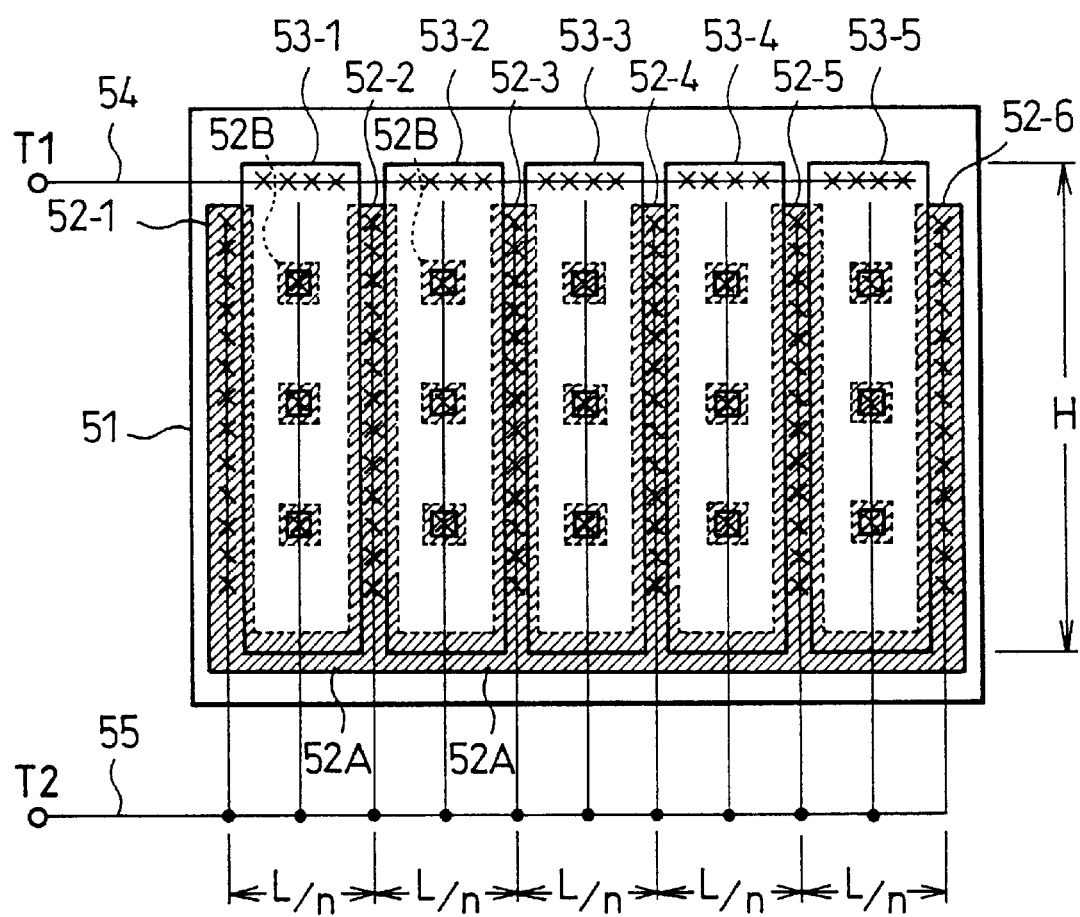
FIG. 10 is a top view of a still further MOS capacitor for use in a charge pump circuit according to the invention.

It is possible to provide a multiplicity of recessed areas formed on the N+ gate regions 53-1–53-5 between the N+ regions 52-1–52-6 and a multiplicity of dotted N+ regions 52B formed on the respective recessed areas to serve as electrodes as shown in FIG. 10. The dotted N+ regions 52B can be then connected by longitudinally extending lead wires 55.

Provision of the N+ regions 52A at one ends of the respective N+ regions 52-1–52-6 for connecting them together, longitudinally extending lead wires 54 for connected with the gate electrodes 53-1–53-5, and the multiplicity of dotted N+ electrode regions 52B between the N+ regions 52-1–52-6, as shown in FIGS. 9 and 10, will further improve the frequency response of the MOS capacitors.

Incidentally, provision of such extra N⁺ regions results in a decrease in effective area of the gate electrode so that the area of the MOS capacitor must be increased by that amount used up for the extra N⁺ regions in order to secure the same capacity as a conventional one. To do this, capacitors in the later half stages of the charge pump circuit, especially one in the last stage, may have a different structure than that of an inventive MOS capacitor.

Figure 1:
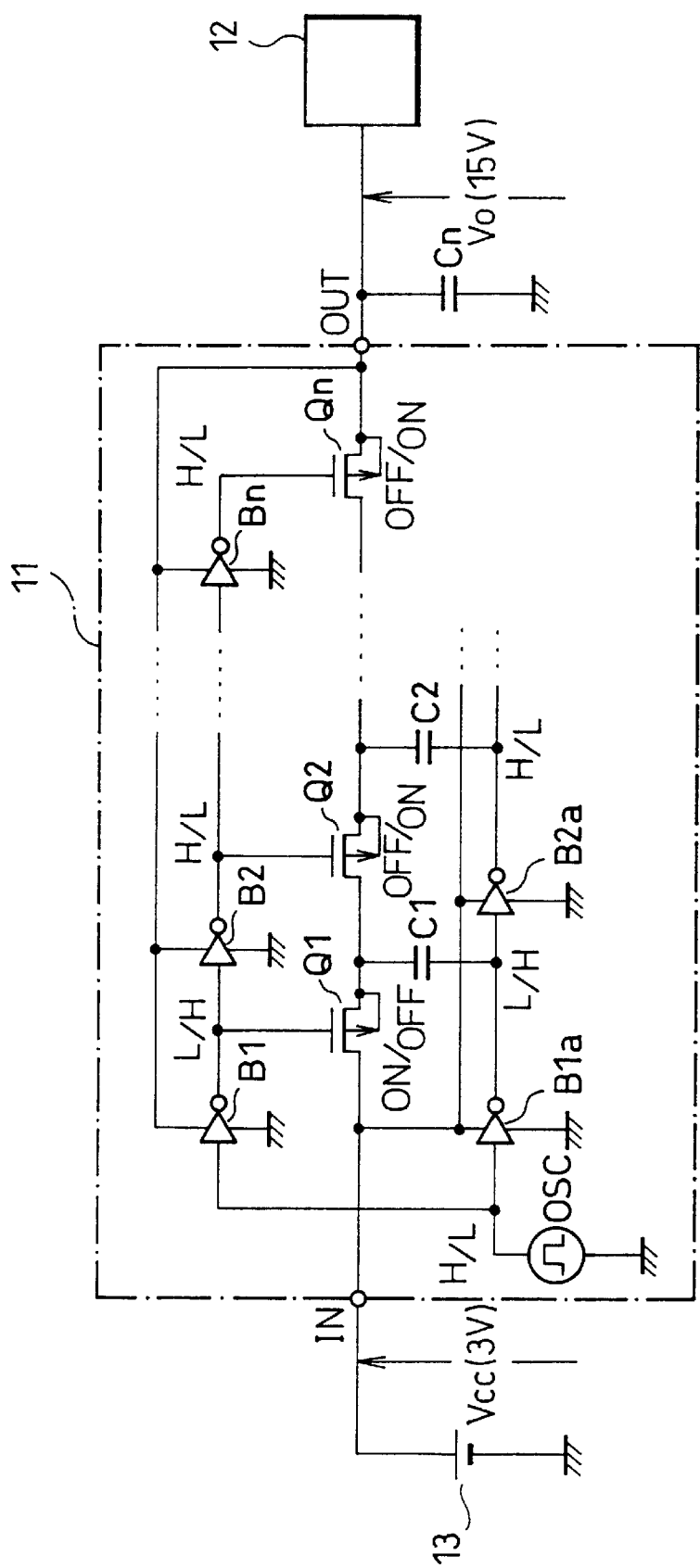
FIG. 1 is a diagramatic representation of a typical charge pump circuit.

Effective application of the inventive MOS capacitor to a charge pump circuit is to use the MOS capacitor in the early stages of the circuit as shown in FIG. 1 where the capacitance C still has a voltage dependence under a given applied voltage, i.e. the Vg-C characteristic is not saturated yet. Therefore, it is preferred to use the inventive MOS capacitor in the first stage of the charge pump circuit where the capacitor is subjected to a low voltage.

What we claim is:

1. A semiconductor apparatus having a charge pump circuit which includes MOSFETs and MOS capacitors formed on the same substrate, wherein at least one of said MOS capacitors comprises:

a multiplicity of first electrodes formed at multiple locations within one region of said substrate, wherein said multiplicity of first electrodes are interconnected;

insulating layers formed on/above respective substrate regions between neighboring first electrodes, each layer covering at least the respective substrate region; and a multiplicity of second electrodes formed on/above said respective insulating layers, wherein said multiplicity of second electrodes are interconnected;

wherein said one region is a semiconductor region having a specific conduction type isolated from other regions by isolation regions, and each of said multiplicity of first electrodes has a high conductivity and is formed by increasing the conductivity of said one region, and said insulating layer is an insulating oxide layer, and, and wherein the number of said first electrodes is equal to or greater than 3; and wherein all said first electrodes have the same conduction type, and all said first electrodes being formed within one region of the same conduction type.

2. The semiconductor apparatus according to claim 1, wherein the number of said second electrodes is one less than the number of said first electrodes.

3. The charge pump circuit according to claim 1, wherein said first electrodes and said second electrodes are arranged at approximately regular intervals respectively.

4. The semiconductor apparatus according to claim 1, wherein each of said multiplicity of first electrodes has an elongate rectangular shape extending in parallel with other of said multiplicity of first electrodes; and each of said multiplicity of second electrodes has an elongate rectangular shape extending between two of said neighboring first electrodes.

5. A charge pump circuit comprising:

a multiplicity of first electrodes formed at multiple locations within one region of a substrate, wherein said multiplicity of first electrodes are interconnected;

insulating layers formed on/above respective substrate regions between neighboring first electrodes, each layer covering at least the respective substrate region; and a multiplicity of second electrodes formed on/above said respective insulating layers, wherein said multiplicity of second electrodes are interconnected;

wherein said one region is a semiconductor region having a specific conduction type isolated from other regions by isolation regions, and each of said multiplicity of first electrodes has a high conductivity and is formed by increasing the conductivity of said one region, and said insulating layer is an insulating oxide layer, and wherein the number of said first electrodes is equal to or greater than 3; and wherein all said first electrodes have the same conduction type, and all said first electrodes being formed within one region of the same conduction type.

6. The charge pump circuit according to claim 5, further comprising:

a first MOS capacitor used as a first charge pump capacitor in a first stage of said charge pump circuit; and a second MOS capacitor in a last stage of said charge pump circuit different in structure from said one of the MOS capacitors in said first stage.

7. The charge pump circuit according to claim 5, further comprising a first lead wire that interconnects said multiplicity of first electrodes.

8. The charge pump circuit according to claim 7, further comprising another region of said substrate that electrically interconnects said multiplicity of first electrodes.

9. The charge pump circuit according to claim 5, further comprising a second lead wire that interconnects the multiplicity of second electrodes.

10. The charge pump circuit according to claim 9, further comprising additional lead wires wherein each additional lead wire connects to said second lead wire and connects to multiple locations along one of said second electrodes.

11. The charge pump circuit according to claim 5, further comprising a multiplicity of recessed areas wherein each of said multiplicity of recessed areas is formed within one of said multiplicity of second electrodes.

12. The charge pump circuit according to claim 11, further comprising a multiplicity of third electrodes wherein each of said multiplicity of third electrodes is formed on one of said multiplicity of recessed areas.

13. The charge pump circuit according to claim 12, further comprising a third lead wire that connects to at least one of said multiplicity of third electrodes.

14. The semiconductor apparatus according to claim 5, wherein the number of said second electrodes is one less than the number of said first electrodes.

15. The charge pump circuit according to claim 5, wherein said first electrodes and said second electrodes are arranged at approximately regular intervals respectively.

16. The semiconductor apparatus according to claim 5, wherein each of said multiplicity of first electrodes has an elongate rectangular shape extending in parallel with other of said multiplicity of first electrodes; and each of said multiplicity of second electrodes has an elongate rectangular shape extending between two of said neighboring first electrodes.

* * * * *